(12) United States Patent
Iwata et al.

(10) Patent No.: US 10,746,836 B2
(45) Date of Patent: Aug. 18, 2020

(54) DIAGNOSTIC DEVICE FOR CURRENT SENSOR

(71) Applicant: DENSO CORPORATION, Kariya, Aichi-Pref (JP)

(72) Inventors: Shuichi Iwata, Nisshin (JP); Yuki Jojima, Nagoya (JP)

(73) Assignee: DENSO CORPORATION, Kariya (JP)

( * ) Notice: Subject to any disclaimer, the term of this patent is extended or adjusted under 35 U.S.C. 154(b) by 79 days.

(21) Appl. No.: 16/104,017

(22) Filed: Aug. 16, 2018

(65) Prior Publication Data

US 2019/0094328 A1 Mar. 28, 2019

(30) Foreign Application Priority Data

Sep. 22, 2017 (JP) ................. 2017-182921

(51) Int. Cl.
| | | |
|---|---|---|
| *G01R 19/10* | (2006.01) | |
| *G01R 19/165* | (2006.01) | |
| *B60K 35/00* | (2006.01) | |
| *B60L 1/00* | (2006.01) | |
| *G01R 35/00* | (2006.01) | |
| *H02P 27/06* | (2006.01) | |
| *G06F 1/28* | (2006.01) | |
| *G01R 31/00* | (2006.01) | |

(52) U.S. Cl.
CPC ............ *G01R 35/007* (2013.01); *G01R 35/00* (2013.01); *G06F 1/28* (2013.01); *H02P 27/06* (2013.01); *G01R 31/006* (2013.01)

(58) Field of Classification Search
CPC ....... G01R 35/00; G01R 35/007; G01R 19/10; G01R 19/165; G01R 19/16542; G06F 1/28; H02P 27/06; B60K 35/00; B60L 1/00
See application file for complete search history.

(56) References Cited

U.S. PATENT DOCUMENTS

| 2018/0118028 A1* | 5/2018 | Ueo ..................... B60K 35/00 |
| 2019/0187219 A1* | 6/2019 | Inada ................... H02M 7/537 |

FOREIGN PATENT DOCUMENTS

| JP | 2015-192582 A | 11/2015 |
| JP | 2017-028966 A | 2/2017 |

* cited by examiner

*Primary Examiner* — Neel D Shah
(74) *Attorney, Agent, or Firm* — Oliff PLC

(57) ABSTRACT

A diagnostic device for a current sensor disclosed herein may include an AC power calculation unit, a DC power calculation unit, and a determination unit. The AC power calculation unit may be configured to calculate AC power outputted from the inverter based on a measurement value measured by the current sensor. The DC power calculation unit may be configured to calculate DC power outputted from a DC power source that supplies power to the inverter. The determination unit may be configured to output a signal for notifying occurrence of an abnormality of the current sensor in a case where a difference between the calculated AC power and the calculated DC power is larger than a predetermined threshold.

4 Claims, 4 Drawing Sheets

DIAGNOSTIC DEVICE FOR CURRENT SENSOR

CROSS-REFERENCE TO RELATED APPLICATION

This application claims priority to Japanese patent application No. 2017-182921, filed on Sep. 22, 2017, the entire contents of which are incorporated herein by reference.

TECHNICAL FIELD

The disclosure herewith relates to a diagnostic device for a current sensor for measuring current flowing between an inverter and an AC motor.

BACKGROUND

An electric vehicle is provided with a DC power source, an inverter, and an AC motor for traveling. The inverter converts power (DC power) from the DC power source to AC power for driving the AC motor. A current sensor for measuring current flowing between the inverter and the AC motor is provided to cause an output of the AC motor to follow a target output. Three-phase alternating current has its phases shifted by 120 degrees from each other. Due to this, measurement of current values of two phases allows a current value of a remaining one phase to be estimated. Meanwhile, an electric vehicle provided with a current sensor for each of three phases to obtain accurate current values is described in Japanese Patent Application. Publication No. 2015-192582. The electric vehicle of Japanese Patent Application Publication No. 2015-192582 detects an abnormality of its current sensors from a sum of the current values of the three phases.

Further, Japanese Patent Application Publication No. 2017-028966 describes a device that is provided with current sensors for two phases of three-phase alternating current, and diagnoses an abnormality of the current sensors based on measurement values obtained from the respective current sensors for the two phases. The diagnostic device of Japanese Patent Application Publication No. 2017-028966 specifies an AC peak value for each of the two phases. It determines that an abnormality is occurring in one of the current sensors when a deviation of the peak values of the two phases is greater than a threshold.

SUMMARY

The technique of Japanese Patent Application Publication No. 2017-028966 can detect an abnormality from measurement values from the two current sensors that measure the current for two phases out of three phases. However, since it uses an AC peak value of each of the two phases, its diagnosis cannot be carried out unless an output of an inverter is stable. A technique capable of detecting an abnormality of a current sensor even when an output of an inverter is not stable is being desired.

The disclosure herein discloses a diagnostic device for a current sensor for measuring current flowing between an inverter and an AC motor. The diagnostic device may comprise an AC power calculation unit, a DC power calculation unit, and a determination unit. The AC power calculation unit may be configured to calculate AC power outputted from the inverter based on a measurement value measured by the current sensor. The DC power calculation unit may be configured to calculate DC power outputted from a DC power source that supplies power to the inverter. The determination unit may be configured to output a signal for notifying an abnormality of the current sensor in a case where a difference between the calculated AC power and the calculated DC power is larger than a predetermined threshold. This diagnostic device can detect an abnormality of the current sensor even when an output of the inverter is not stable because it does not need an AC peak value for the detection.

An AC motor may be a three-phase AC motor. In a case of three-phase AC, if current values for two phases can be measured, a current value for the remaining one phase can be estimated. However, in most of electric vehicles, a current sensor may be provided for each of three phases of power cables that transmit three-phase AC from an inverter to an AC motor in order to ensure robustness. Even when one of the three current sensors is failed, the AC motor can be continuously controlled with the remaining two current sensors. That is, the electric vehicle can continue to travel even when one of the three current sensors is failed. However, when another one of the three current sensors is failed, the electric vehicle comes to be unable to travel. Therefore, the diagnostic device may be configured not to start a diagnosis while all of the three current sensors are operating normally and configured to start the diagnosis when an abnormality occurs in one of the current sensors. In this case, the AC power calculation unit may be configured to calculate the AC power based on measurement values measured by two of the current sensors that operate normally when the AC motor is controlled based on the measurement values measured by the two of the current sensors that operate normally. By the diagnostic device starting the diagnosis when one of the three current sensors is failed, an abnormality in another one of the current sensors can be found.

The predetermined threshold may be set to a value larger than a power consumption of a specific device to which power is supplied from the DC power source. In an electric vehicle, its DC power source supplies power to another device other than its inverter, in some cases. In this case, the AC power may be compared with a value that is obtained by subtracting a power consumption of the other device from power outputted from the DC power source. An influence of the other device's power consumption on the diagnosis for the current sensor can be eliminated.

The determination unit may be configured to output the signal for notifying the abnormality of the current sensor in a case where the difference between the calculated AC power and the calculated DC power remains larger than the predetermined threshold over a predetermined time or longer. In a case where the current sensor malfunctions temporarily due to some sort of cause but it returns to its normal operation immediately thereafter, an erroneous detection of abnormality can be prevented.

Details of the technique disclosed herein and further improvements thereto will be described in "DETAILED DESCRIPTION" below.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide an improved diagnostic device for a current sensor, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Figure 1:
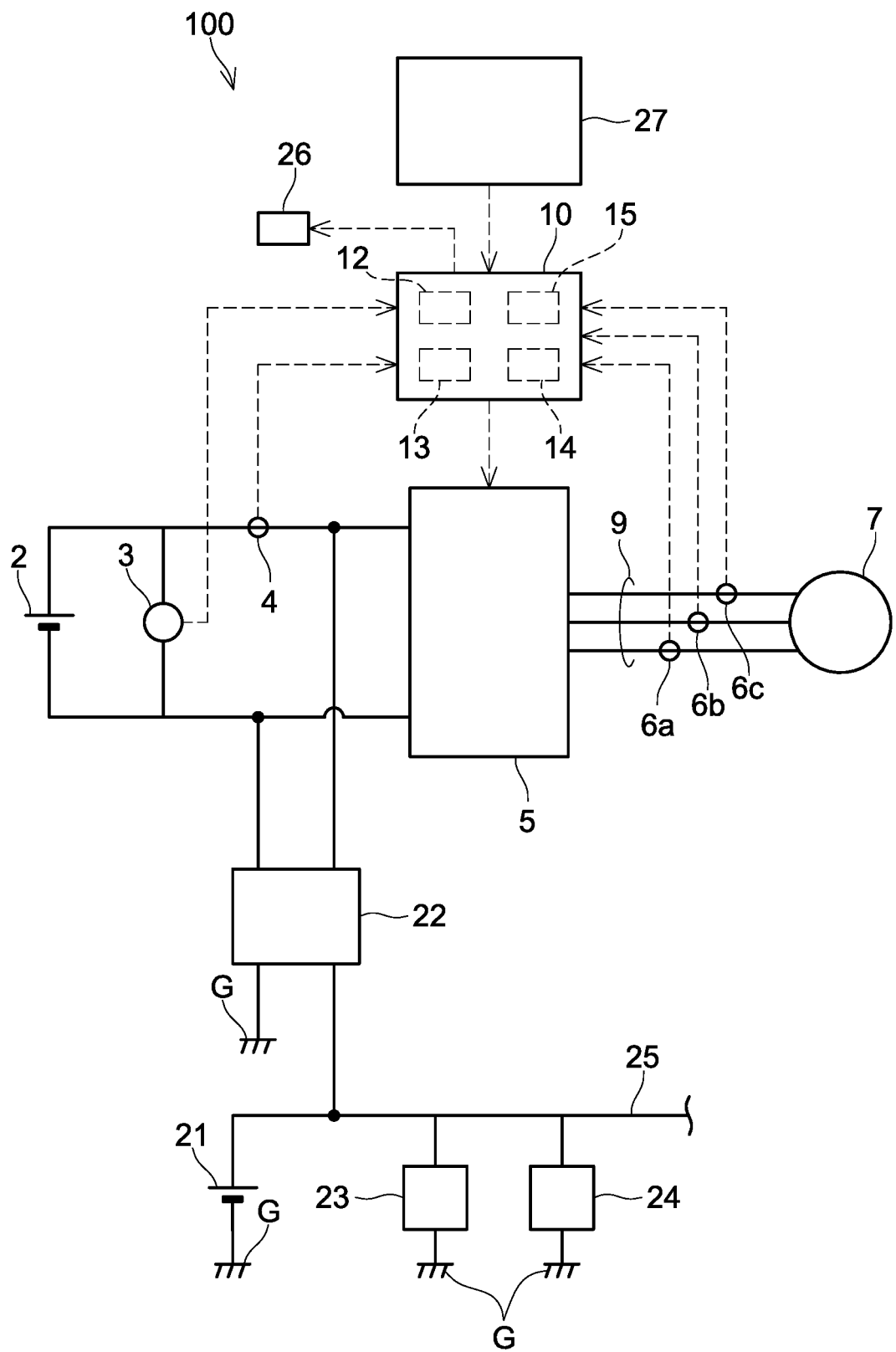
FIG. 1 is a block diagram of a power system of an electric vehicle that includes a diagnostic device of an embodiment.

A diagnostic device for a current sensor according to an embodiment will be described with reference to the drawings. The current sensor diagnostic device of the embodiment is installed in an electric vehicle. FIG. 1 shows a block diagram of a power system of an electric vehicle 100 including the current sensor diagnostic device. Hereinbelow, the "current sensor diagnostic device" will simply be termed a "diagnostic device" for the sake of expedience.

Firstly, the power system of the electric vehicle 100 will be described. FIG. 1 shows the block diagram of the power system of the electric vehicle 100. The electric vehicle 100 of the embodiment includes a high voltage battery 2, an inverter 5, a motor 7 for traveling, and a controller 10. The inverter 5 converts DC power from the high voltage battery 2 to AC power and supplies the AC power to the motor 7. The motor 7 is a three-phase AC motor. The inverter 5 includes a plurality of power conversion switching elements, and the controller 10 receives an instruction from a host controller 27 and drives the switching elements of the inverter 5. The host controller 27 calculates a target output of the motor 7 from a vehicle speed and an accelerator position, and instructs the same to the controller 10.

Each of power cables 9 that transmit three-phase alternating current from the inverter 5 to the motor 7 is provided with a corresponding one of current sensors 6a, 6b, 6c. Measurement data of the current sensors 6a to 6c are sent to the controller 10. Further, a voltage sensor 3 is provided at both ends of the high voltage battery 2, and a current sensor 4 is provided between the high voltage battery 2 and the inverter 5. Measurement data from the voltage sensor 3 and the current sensor 4 are also sent to the controller 10. The controller 10 controls the inverter 5 based on those measurement data from the sensors so that the instruction (the target output of the motor 7) from the host controller 27 is realized. The controller 10 further diagnoses whether or not an abnormality is occurring in any of the current sensors 6a to 6c based on those measurement data from the sensors. In a case of determining that an abnormality is occurring in any of the current sensors 6a to 6c as a result of the diagnosis, the controller 10 causes an instrument panel 26 to output a message notifying the occurrence of the abnormality. The diagnosis for the current sensors will be described later.

The high voltage battery 2 is also connected to a step-down converter 22. The step-down converter 22 reduces an output voltage from the high voltage battery 2 and supplies the reduced voltage to an auxiliary-device power source line 25. An output negative electrode terminal of the step-down converter 22 is connected to a ground C of a vehicle body. The auxiliary-device power source line 25 is wired throughout the vehicle body, and various auxiliary devices are connected thereto. Examples of the auxiliary devices are a car navigation device 23, an air conditioner 24, and the like. An auxiliary battery 21 is also connected to the auxiliary-device power source line 25. The auxiliary battery 21 is provided for supplying power to the auxiliary devices when the step-down converter 22 is not operating. The output voltage of the high voltage battery 2 exceeds 100 volts, whereas an output voltage of the auxiliary battery 21 is less than 50 volts. The output voltage of the auxiliary battery 21 is typically 12 volts or 24 volts. The auxiliary battery 21 is charged by power outputted by the step-down converter 22. Negative electrodes of the auxiliary battery 21, the car navigation device 23, and the air conditioner 24 are also connected to the ground G.

The controller 10 will be described in detail. The controller 10 is provided with a central processing unit (CPU), a memory, and various IO ports, and operates according to a program stored in the memory. Software modules implemented by the program include a switching element driving unit 12, an AC power calculation unit 13, a DC power calculation unit 14, and a determination unit 15. The switching element driving unit 12 generates a driving signal for driving the switching elements of the inverter 5 based on the instruction from the host controller 27 and the measurement data from the respective sensors. The controller 10 further diagnoses whether or not an abnormality is occurring in any of the current sensors 6a to 6c that measure three-phase alternating current flowing between the inverter 5 and the motor 7. The aforementioned AC power calculation unit 13, DC power calculation unit 14, and determination unit 15 execute a diagnostic process. The controller 10 executing the AC power calculation unit 13, the DC power calculation unit 14, and the determination unit 15 corresponds to the diagnostic device.

Figure 2:
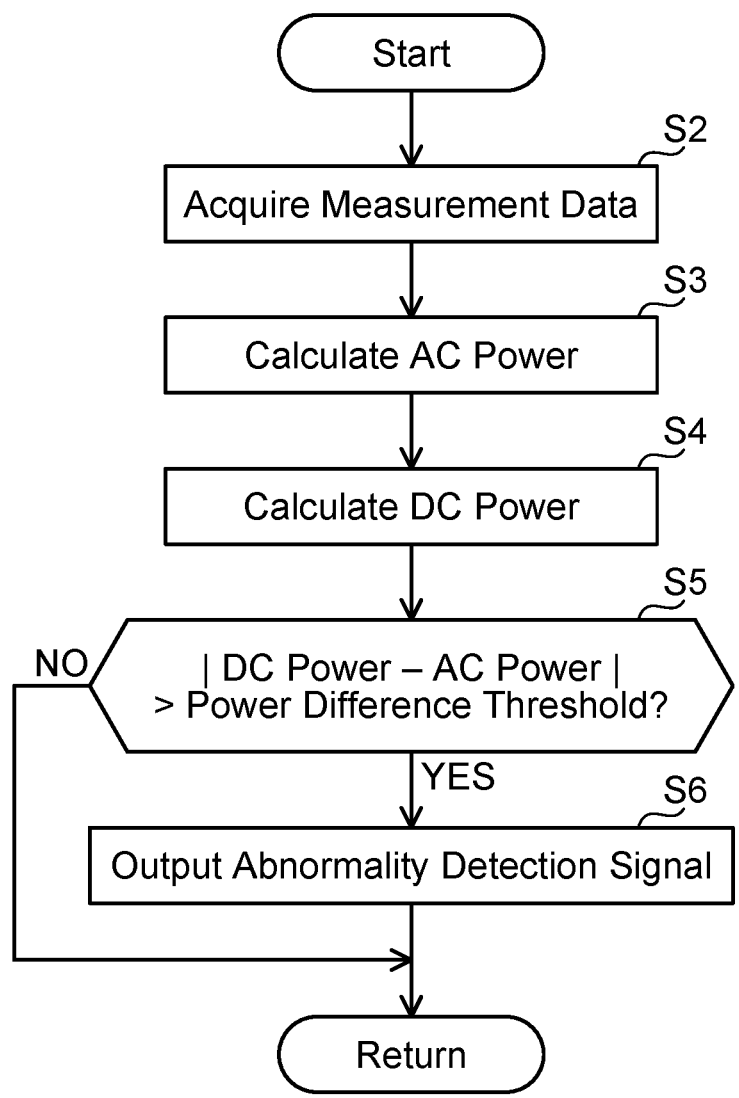
FIG. 2 is a flowchart of a diagnostic process.

The diagnostic process executed by the controller 10 will be described. The diagnostic process is a process that determines whether or not an abnormality is occurring in any of the current sensors 6a to 6c, as aforementioned. FIG. 2 shows a flowchart of the diagnostic process. The controller 10 periodically executes the process of FIG. 2. The controller 10 executes the process of FIG. 2 every minute, for example.

Firstly, the controller 10 acquires the aforementioned measurement data of the respective sensors (step S2). Although not shown, a voltage sensor for measuring a line voltage or a phase voltage of the output AC is provided inside the inverter 5, and measurement data from this voltage sensor is also sent to the controller 10. The diagnostic process uses, especially, the output voltage and an output current of the high voltage battery 2 obtained by the voltage sensor 3 and the current sensor 4, the current of the respective phases of the three-phase alternating current obtained from the current sensors 6a to 6c, and the aforementioned line voltage or phase voltage.

The controller 10 executes the AC power calculation unit 13 to calculate the AC power that the inverter 5 outputs, from the measurement data of the current sensors 6a to 6c (step S3). There are several AC power calculation methods. In one calculation method, the AC power calculation unit 13 sums current values of all the three phases and multiplies the current value sum by an output voltage of the inverter 5 to calculate the AC power. In this embodiment, the output voltage of the high voltage battery 2 is applied to an input terminal of the inverter 5. An effective value of the output voltage of the inverter 5 is obtained from the output voltage of the high voltage battery 2. Alternatively, as aforementioned, the voltage sensor may be provided inside the inverter 5, and the output voltage of the inverter 5 may be obtained from the voltage sensor inside the inverter 5.

In another calculation method, the AC power calculation unit 13 calculates the AC power from the phase current and phase voltage of one of the phases of the three-phase alternating current. In yet another calculation method, the AC power calculation unit 13 calculates the AC power from line current and line voltage of one of the phases of the three-phase alternating current. Any of the aforementioned calculation methods may be employed.

Next, the DC power calculation unit 14 of the controller 10 calculates the DC power supplied to the inverter 5 from the high voltage battery 2 (step S4). The DC power can be obtained simply by multiplying the measurement value of the voltage sensor 3 (the output voltage of the high voltage battery 2) by the measurement value of the current sensor 4 (the output current of the high voltage battery 2).

Next, the determination unit 15 of the controller 10 compares an absolute value of a difference between the calculated AC power and the calculated DC power with a predetermined power difference threshold (step S5). Hereinbelow, the absolute value of the difference between the calculated AC power and the calculated DC power will simply be termed a power difference, for the sake of expedience. In a case where the power difference is smaller than the power difference threshold (step S5: NO), this means that input power to the inverter 5 and the output power from the inverter 5 are substantially equal, so it can be determined that the current sensors 6a to 6c are normal. In this case, the controller 10 terminates the process. The power difference threshold is set to about a same value as an error of a difference between the input power (DC power) and the output power (AC power) which may be seen while the inverter 5 is operating normally. Alternatively, the power difference threshold may be set to a value larger than a conversion loss of the inverter 5. Moreover, as will be descried later, the power difference threshold may be determined by considering power consumption of the auxiliary devices. The power difference threshold may be set to a value larger than a sum of the conversion loss of the inverter 5 and the power consumption of the auxiliary devices.

In a case where the power difference is greater than the power difference threshold (step S5: YES), the determination unit 15 determines that an abnormality is occurring in at least one of the current sensors 6a to 6c. At this occasion, the determination unit 15 of the controller 10 outputs a signal (abnormality detection signal) notifying that an abnormality is occurring in at least one of the current sensors 6a to 6c (step S6). The abnormality detection signal is outputted, for example, to the instrument panel 26 (see FIG. 1). The instrument panel 26 that received the abnormality detection signal displays a message notifying the current sensor abnormality. Alternatively, the abnormality detection signal is outputted to a diagnosis memory (not shown) of the vehicle. The diagnosis memory stores a message corresponding to the abnormality detection signal. The diagnosis memory is a memory for notifying a state of the vehicle to a service staff member of the vehicle.

In the above current sensor diagnostic process, a peak value of the AC output of the inverter 5 is not used. Due to this, the controller 10 (diagnostic device) can accurately perform the diagnosis even when the output of the inverter 5 is not stable.

Figure 3:
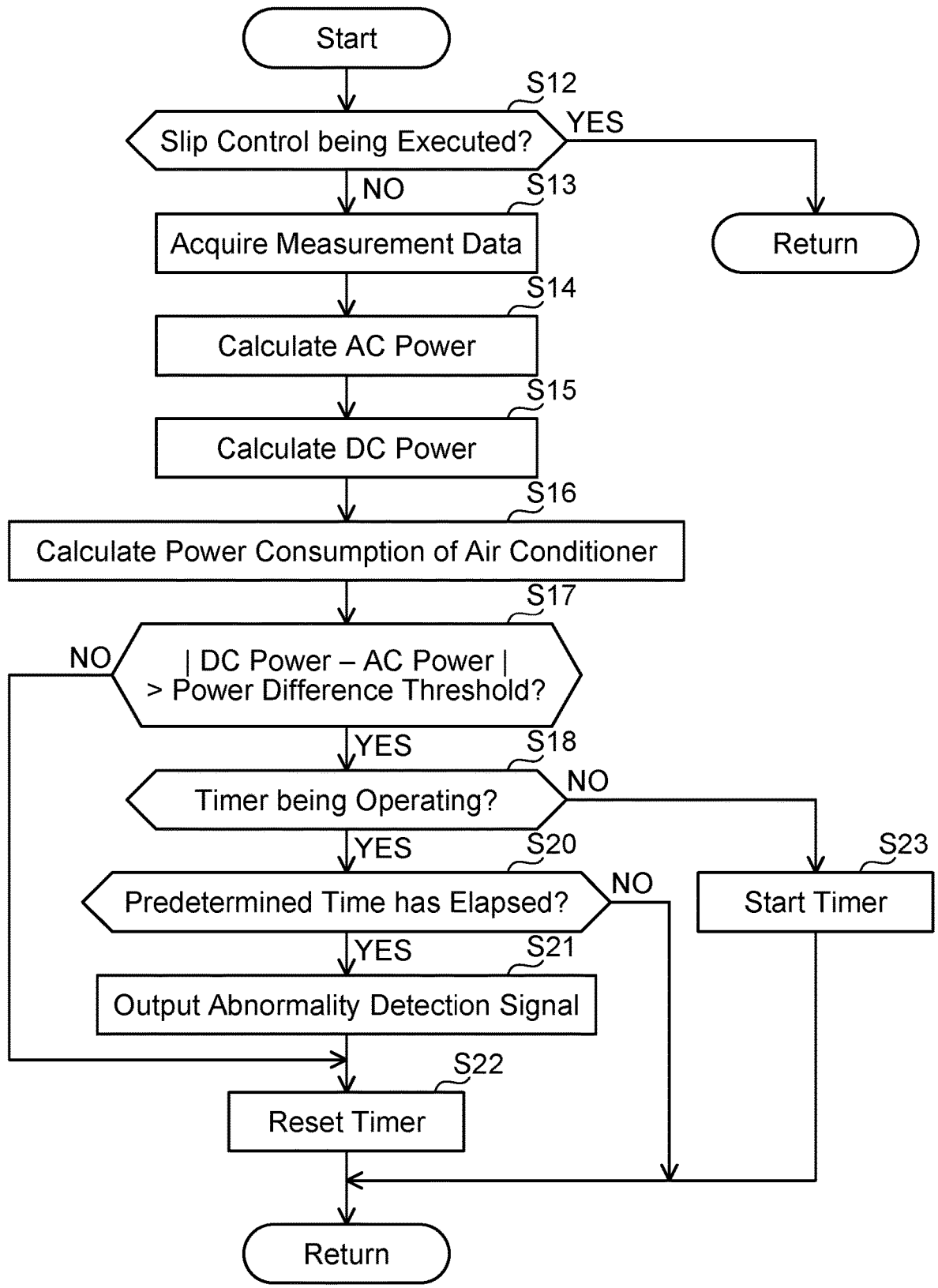
FIG. 3 is a flowchart of a diagnostic process of a first variant.

(First Variant) FIG. 3 shows a flowchart of a diagnostic process of a first variant. The diagnostic process of the first variant includes several improvements to the flowchart of FIG. 2. In the first variant, the controller 10 checks whether or not a slip control is being executed prior to executing the diagnostic process. The controller 10 does not execute the diagnostic process if the slip control is being executed (step S12: YES). During the slip control, the output of the motor 7 (that is, the output of the inverter 5) changes subtly, so an accuracy of the abnormality diagnosis for the current sensors decreases. Due to this, in the first variant, the diagnostic process is not executed during the slip control.

Processes of steps S13, S14, and S15 of FIG. 3 are same as the processes of steps S2, S3, and S4 of FIG. 2. That is, the controller 10 (the diagnostic device) acquires the measurement data of the respective sensors (step S13). Then, the AC power calculation unit 13 of the controller 10 calculates the AC power outputted by the inverter 5 (step S14). Next, the DC power calculation unit 14 of the controller 10 calculates the DC power supplied from the high voltage battery 2 to the inverter 5 (step S15).

Next, the determination unit 15 of the controller 10 calculates power consumption of the vehicle-mounted air conditioner 24 (step S16). Then, the determination unit 15 compares the power difference (the absolute value of the difference between the DC power and the AC power) with the power difference threshold (step S17). The power difference threshold herein is set to a value larger than the power consumption of the air conditioner 24. This is for the following reason. The power for the air conditioner 24 is supplied from the high voltage battery 2 through the step-down converter 22. Due to this, a difference caused by the power consumption of the air conditioner 24 appears between the output power (the DC power) of the high voltage battery 2 and the output power (the AC power) of the inverter 5. In order to eliminate any influence of the power consumption of the air conditioner 24 on the diagnosis for the current sensors 6a to 6c, the power difference threshold in step S17 is set to the value that is larger than the power consumption of the air conditioner 24.

The power difference threshold in step S17 may be changed according to power consumption of a specific auxiliary device that is operating at that time. The specific auxiliary device may include an auxiliary device other than the air conditioner 24.

Next, the determination unit 15 checks whether or not a timer is operating (step S18). The timer is provided to measure a time during which the power difference remains exceeding the power difference threshold. The timer is set in a program which the controller 10 executes. In a case where the timer is not operating (step S18: NO), it means that this is the first time to execute the process of step S18 after the power difference has exceeded the power difference threshold, so the determination unit 15 starts the timer (step S23). In a case where the timer is operating (step S18: YES), it means that the timer was already started in the process of FIG. 3 that previously took place. In this case, the determination unit 15 confirms whether or not a predetermined time has elapsed since the timer started (step S20). When the time during which the power difference remains exceeding the power difference threshold exceeds the predetermined time, the determination unit 15 outputs the signal for notifying the occurrence of abnormality in the current sensor(s) (abnormality detection signal) (step S20: YES, S21). The determination unit 15 waits for the time during which the power difference remains exceeding the power difference threshold to exceed the predetermined time (step S20: NO). The abnormality detection signal is not outputted until the time during which the power difference remains exceeding the power difference threshold exceeds the predetermined time, so that an erroneous determination caused by noise and the like can be prevented. The predetermined time is set to, for example, 30 seconds.

In the determination of step S17, in a case where the power difference does not exceed the power difference threshold (step S17: NO), the determination unit 15 shifts to step S22, resets the timer (step S22), and terminates the process.

Figure 4:
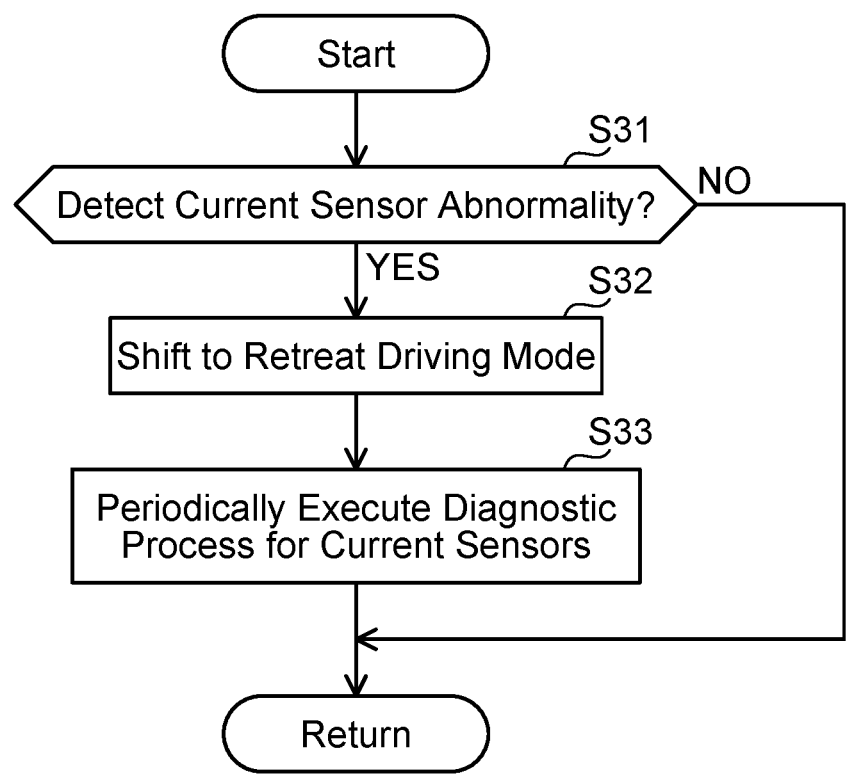
FIG. 4 is a flowchart of a diagnostic process of a second variant.

(Second Variant) FIG. 4 shows a flowchart of a diagnostic process of a second variant. In the second variant, another abnormality detection process is executed prior to the diagnosis process. In this other abnormality detection process, it is checked whether or not an abnormality is occurring in any of the three current sensors 6a to 6c. An algorithm of this other abnormality detection process may be configured in various manners. For example, it may be an algorithm which uses measurement values from two current sensors out of the three current sensors 6a to 6c to estimate a measurement value of the remaining current sensor and compares the estimated measurement value with its actual measurement value to find an abnormality in the current sensor.

When an abnormality is detected in one current sensor among the three current sensors 6a to 6c (step S31: YES), the host controller 27 (see FIG. 1) changes a driving mode to a retreat driving mode (step S32). The retreat driving mode is a mode for continuing to drive without aggravating damage by suppressing the motor output or the like in a case where the host controller 27 has detected some sort of abnormality in the vehicle system but determined that the driving can be continued. When the mode shifts to the retreat driving mode, the current sensor diagnostic device (the controller 10) periodically executes the diagnostic process of FIG. 2 or 3 (step S33). In a case where all the three current sensors 6a to 6c are normal (step S31: NO), the diagnostic process is not initiated.

The diagnostic process of the second variant can be summarized as follows. The motor 7 for traveling in the electric vehicle 100 is the three-phase AC motor. The current sensors 6a to 6c are provided respectively on the three-phase power cables 9 connecting the inverter 5 and the motor 7. The diagnostic device (the controller 10) does not start the diagnosis while all the three current sensors 6a to 6c are operating normally. The diagnostic device (the controller 10) starts the diagnosis when an abnormality is found in one of the current sensors 6a to 6c. When the motor 7 is being controlled based on the measurement values of the two current sensors that are operating normally, the AC power calculation unit 13 calculates the AC power outputted by the inverter 5 based on the measurement values of those two current sensors that are operating normally. At this occasion, the AC power calculation unit 13 uses the measurement data of the two current sensors that are operating normally to estimate the current value of the remaining phase. The AC power calculation unit 13 calculates the AC power outputted by the inverter 5 based on the current values of the respective phases including the estimated value.

Based on the measurement data of the voltage sensor 3 and the current sensor 4, the DC power calculation unit 14 calculates the DC power outputted by the high voltage battery 2 that supplies the power to the inverter 5. In a case where the power difference between the calculated AC power and the calculated DC power is greater than the power difference threshold, the determination unit 15 outputs the signal notifying that an abnormality has occurred in one of the two of the current sensors 6a to 6c that had been normal. As the power difference threshold herein, a value larger than the value of the power consumption of the auxiliary device that is currently operating, such as the air conditioner, may be set. As the power difference threshold, a value that is larger than a value which is obtained by adding the conversion loss of the inverter 5 to the power consumption of the auxiliary device that is currently operating may be set.

By causing the diagnostic device (the controller 10) to start the diagnosis when one of the three current sensors 6a to 6c has failed, the diagnostic process of the second variant can detect the abnormality in another one of the current sensors.

Some of the features related to the technique described in the embodiment will be described. In the case where the three current sensors 6a to 6c are normal prior to the diagnostic process being executed, the diagnostic device (the controller 10) may output the abnormality detection signal to the host controller 27 when detecting an abnormality in one current sensor. The host controller 27 may shift the mode to the retreat driving mode as aforementioned, and may control the motor 7 by using the remaining two current sensors without using the failed current sensor. When the diagnostic device (the controller 10) detects an abnormality in another one of the current sensors as in the second variant, the host controller 27 immediately stops a driving system of the vehicle. This is because the motor 7 cannot be controlled normally by using only one current sensor.

The controller 10 executing the AC power calculation unit 13, the DC power calculation unit 14, and the determination unit 15 corresponds to an example of a diagnostic device for a current sensor. The high voltage battery 2 corresponds to an example of a DC power source.

The motor 7 of the embodiment is the three-phase AC motor, however, the technique disclosed herein can be applied to a diagnostic device for a current sensor between an inverter and an AC motor that is other than the three-phase type. Further, the technique disclosed herein may be applied to a current sensor between a motor for traveling and an inverter in a hybrid vehicle or a fuel cell vehicle. In a case of the fuel cell vehicle, the DC power source may be a fuel cell.

A representative current sensor is a sensor that uses hole elements, however, the technique disclosed herein may be applied regardless of types of the current sensor.

Specific examples of the present invention has been described in detail, however, these are mere exemplary indications and thus do not limit the scope of the claims. The art described in the claims include modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A diagnostic device for a current sensor for measuring current flowing between an inverter and an AC motor, the diagnostic device comprising:
   an AC power calculation unit configured to calculate AC power outputted from the inverter based on a measurement value measured by the current sensor;
   a DC power calculation unit configured to calculate DC power outputted from a DC power source that supplies power to the inverter; and
   a determination unit configured to output a signal for notifying an abnormality of the current sensor in a case where a difference between the calculated AC power and the calculated DC power is larger than a predetermined threshold.

2. The diagnostic device of claim 1, wherein
   the AC motor is a three-phase AC motor,
   the current sensor is provided for each of three phases of power cables that transmit three-phase AC from the inverter to the AC motor,
   the diagnostic device is configured not to start a diagnosis while all of the three current sensors are operating normally and configured to start the diagnosis when an abnormality occurs in one of the current sensors, and
   the AC power calculation unit is configured to calculate the AC power based on measurement values measured by two of the current sensors that operate normally when the AC motor is controlled based on the measurement values measured by the two of the current sensors that operate normally.

3. The diagnostic device of claim 1, wherein
   the predetermined threshold is set to a value larger than a power consumption of a specific device to which power is supplied from the DC power source.

4. The diagnostic device of claim 1, wherein
   the determination unit is configured to output the signal for notifying the abnormality of the current sensor in a case where the difference between the calculated AC power and the calculated DC power remains larger than the predetermined threshold over a predetermined time or longer.

* * * * *